United States Patent [19]
Nakamura et al.

[11] Patent Number: 5,128,863
[45] Date of Patent: Jul. 7, 1992

[54] CLAMPING CIRCUIT FOR CMOS-INPUT-TYPE IC AND POWER SWITCHING CIRCUIT

[75] Inventors: Shigeichi Nakamura, Tokyo; Yujiro Yamashita; Makoto Inoue, both of Yokohama; Seiichi Sato, Tokyo, all of Japan

[73] Assignee: Namco Ltd., Tokyo, Japan

[21] Appl. No.: 522,930

[22] Filed: May 14, 1990

[30] Foreign Application Priority Data

May 15, 1989 [JP] Japan .................. 1-121865

[51] Int. Cl.⁵ .............................................. G11C 13/00
[52] U.S. Cl. ...................... 364/410; 365/228; 371/66
[58] Field of Search ............ 364/707, 410; 371/66; 365/228, 229

[56] References Cited

U.S. PATENT DOCUMENTS

| | | | |
|---|---|---|---|
| 4,290,119 | 9/1981 | Masuda et al. | 365/229 |
| 4,607,351 | 8/1986 | Gerber et al. | 365/229 |
| 4,617,473 | 10/1986 | Bingham | 365/229 |
| 4,692,903 | 9/1987 | Borg et al. | 365/229 |
| 4,771,407 | 9/1988 | Takemae et al. | 371/66 |
| 4,777,626 | 10/1988 | Matsushita et al. | 365/229 |
| 4,815,041 | 3/1989 | Baylock | 365/229 |
| 4,884,242 | 11/1989 | Lacy et al. | 371/66 |
| 4,984,211 | 1/1991 | Tran | 365/229 |

OTHER PUBLICATIONS

"Battery Backup Circuit For CMOS RAM", IBM Technical Disclosure Bulletin, vol. 27, No. 11, Apr. 1985.

Primary Examiner—Gail O. Hayes
Attorney, Agent, or Firm—Oliff & Berridge

[57] ABSTRACT

An integrated circuit using, at least in its input end, a CMOS IC. This CMOS-input-type IC comprises an input terminal to which a signal is to be inputted, a switching signal terminal to which a switching signal for shifting from a main power source to a backup power source is to be inputted, and clamping means disposed between the input terminal and remaining parts of the CMOS-input-type-IC. The clamping means comprises an output buffer circuit which forcibly lowers or raises the signal, which is to be inputted to said input terminal, to a low level or a high level, respectively, when the switching signal is inputted to said switching signal terminal. With this clamping means, it is possible to prevent, for a long time, a rush current from generating in the CMOS-input-type IC when the power source is switched from the main power source to the backup power source, thus preventing the supply voltage from lowering.

12 Claims, 6 Drawing Sheets

CLAMPING CIRCUIT FOR CMOS-INPUT-TYPE IC AND POWER SWITCHING CIRCUIT

BACKGROUND OF THE INVENTION

1. Field of the Invention

This invention relates to a CMOS-input-type IC using, at least in its input end, a CMOS circuit, and also to a power source switching circuit for the IC.

2. Description of the Related Art

As great advances have recently been made in semiconductor technology, the application of CMOS-input-type ICs to various fields is on the rise. Particularly in custom ICs, the CMOS-input-type IC has been the pivotal.

Generally, custom ICs manufactured by CMOS process consume only a very small quantity of electrical power during operation. So CMOS-type custom ICs have been widely used in controlling SRAMs when the quantity of power is limited. As a common practice, this kind of circuit is equipped with a backup power source in order to maintain data in an SRAM when main power source voltage drops; at that time, the power source for the custom IC and the SRAM is switched from the main power source to the backup power source.

However, with this conventional CMOS-type custom IC, when shifting the main power source to the backup power source, a relatively large rush current lasting tens of msec would flow in an input buffer to cause a voltage drop of in the backup power source. Therefore, the data in the SRAM would be destroyed even if a backup power source is used.

This type of circuit is popularly used in cartridges for TV games. In a case, where data in the SRAM of a game cartridge is destroyed during the time when a player is playing a game, the player must restart the game from the beginning.

Figures 4, 6:
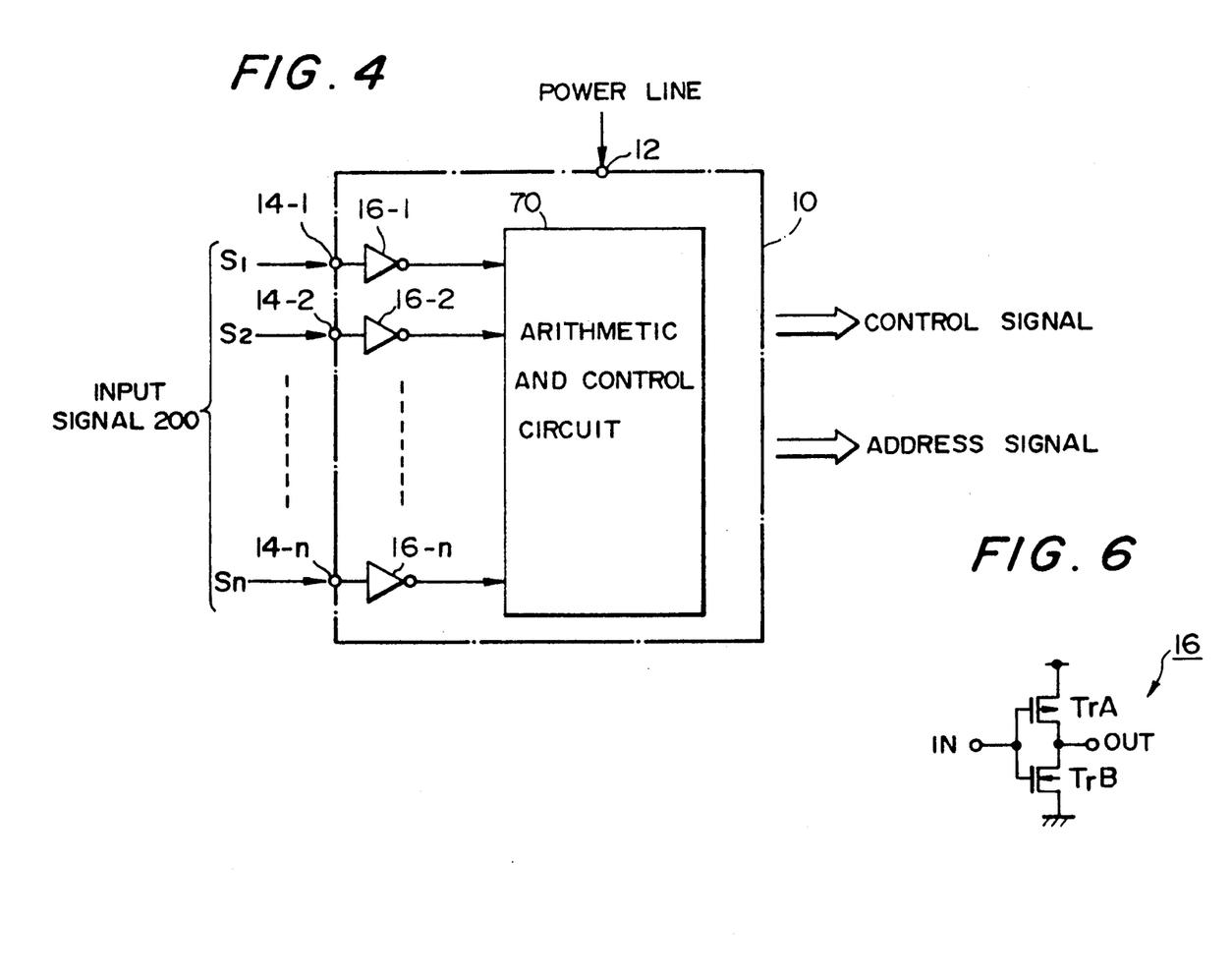
FIG. 4 is a diagram showing a typical conventional CMOS-input-type IC.
FIG. 6 is a detailed circuit diagram showing a buffer (inverter) located at the input side of the CMOS-input-type IC.

FIG. 4 of the accompanying drawings shows a typical conventional CMOS-type custom IC to be used as a control for SRAM. This custom IC 10 has a power supply terminal 12 and a plurality of input terminals 14-1, 14-2, . . . 14-n. The power supply terminal 12 is connected to a main power source having a large capacity. Signals S1, S2, . . . Sn inputted from the respective input terminals 14-1, 14-2, . . . 14-n are inputted, via inverter circuits 16-1, 16-2, . . . 16-n being used as input buffers, to an internal arithmetic and control circuit 70 where various kinds of operational and control actions are performed to control a non-illustrated SRAM.

Figure 5A:
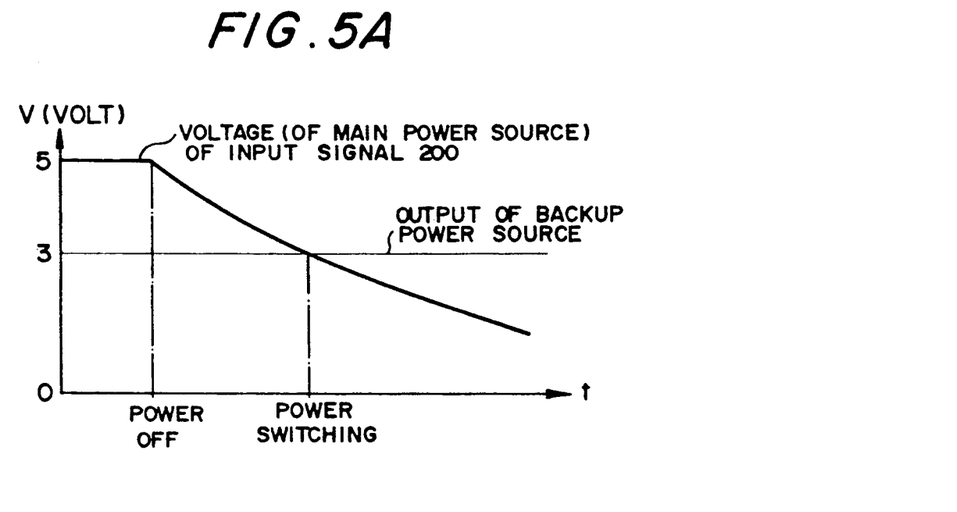
FIG. 5A is a timing chart of the conventional art.

As shown in FIG. 5A, when the main power source is turned off, the power supply terminal 12 is then connected with the backup power source so that the custom IC 10 and the non-illustrated SRAM are operable so as to hold the data stored in the SRAM.

In the individual input buffer (i.e., inverter circuit 16 in FIG. 4), the source of a p-channel MOSFET is connected to a supply line while the source of an n-channel MOSFET is connected to a ground line and the drain of the p-channel MOSFET is connected to the drain of the n-channel MOSFET.

In the operation of the p-channel and n-channel MOSFETs, there exists a transitional area where both MOSFETs can assume an ON state temporarily when the individual MOSFETs shift from the ON state to the OFF state as the gate voltage varies. In this transitional area, both the supply line and the ground line become conductive to allow a rush current to flow.

Generally, since the gate voltage is shifted substantially instantaneously, the time during which this rush current flows is very short, and hence the accumulated rush current is negligible.

With the main power source turned off, the input voltage becomes non-stable so that the gate voltage stays in the transitional area for a long period of time.

FIG. 6 shows an inverter circuit 16 which is the simplest form of a CMOS circuit used as an input buffer. In FIG. 6, TrA and TrB stand for a p-channel MOSFET and an n-channel MOSFET, respectively. If its input IN (gate voltage) to inverter circuit 16 is high, TrB is turned on and TrA is turned off so that output OUT (drain) of inverter circuit 16 will be conductive with the ground line (low). On the contrary, if input IN is low, TrA is turned on while TrB is turned off so that output OUT will be conductive with the supply line (high). Because the threshold of TrA is usually higher than that of TrB, there exists a transitional area where the ON states of both TrA and TrB overlap. In this transitional area, the supply line and the ground line become conductive to allow a rush current to flow.

As discussed above, since the gate voltage of each of TrA and TrB are shifted instantaneously, the accumulated rush current would be negligible. However, if the main power source is turned off, the input voltage becomes non-stable so that the gate voltage will stay in the transitional area over a long period of time.

Figure 7A:
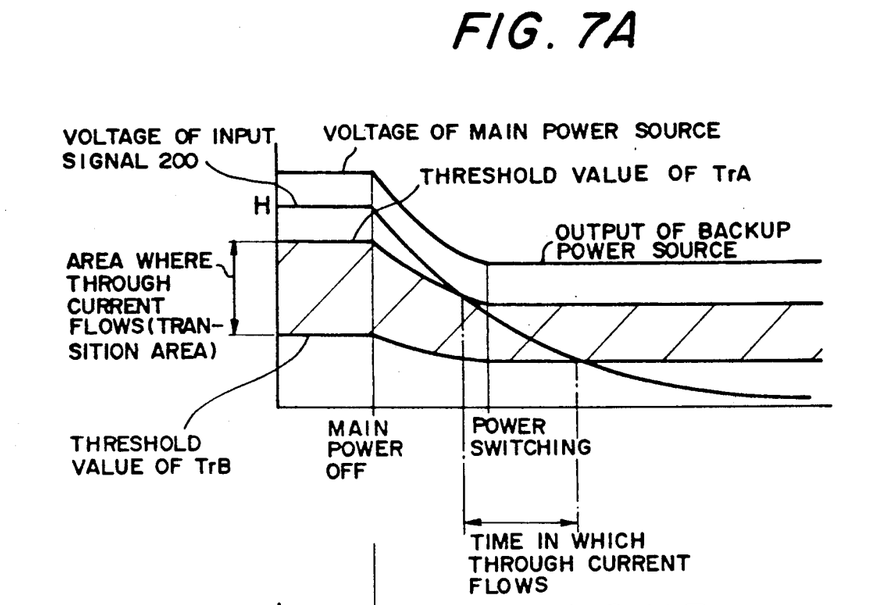
FIG. 7A is the case in which the input signal voltage is progressively lowered from the high level.
Figure 7B:
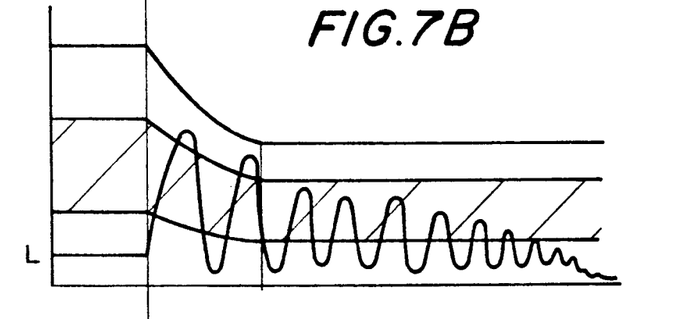
FIG. 7B is the case in which it oscillates from the low level.
Figure 7C:
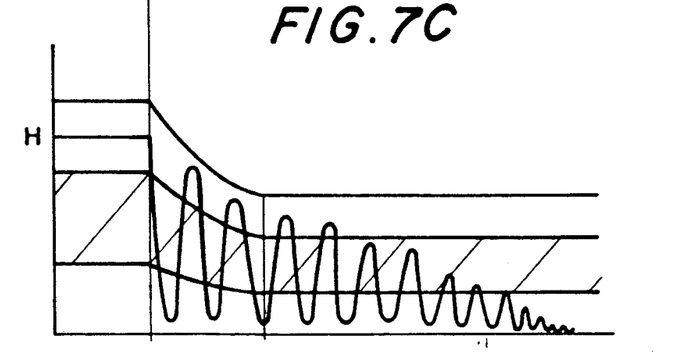
FIG. 7C is the case in which it oscillates from the high level.

FIGS. 7A, 7B and 7C shows how the transitional area (where a rush current may flow) of inverter circuit 16 changes and how the voltage input of signals to input terminals 14-1, 14-2, . . . 14-n relate to the transistional area, when the power source of a CMOS-input-type IC is switched from the main power source of 5 V to the backup power source of 3 V.

The voltage of the input signal to input terminals 14-1, 14-2, . . . 14-n of the CMOS-input-type IC varies at a rate different from the changing rate of the transitional area, depending on the characteristic of the circuit.

Since the backup power source will not be connected to the circuit forwardly of the CMOS-input-type IC in particular, the input signal voltage may oscillate, depending on the state, as the main power source is cut off. Consequently it is difficult to foresee how the signal voltage will change.

FIG. 7A shows the change when the input signal voltage input terminal 14-1, 14-2, . . . 14-n is lowered progressively from the high level; FIG. 7B shows the change when the signal voltage oscillates from the low level; and FIG. 7C shows the change when the signal voltage oscillates from the high level.

In FIG. 7A, the input signal voltage crosses the transitional area over a long period of time, while in FIG. 7B and 7C, it repeatedly enters the transitional area, thus staying in the transitional area.

As the input signal thus stays in the transitional area over a long period of time, a rush current flows from the supply line to the ground line in the CMOS-input-type IC for a long period of time so that a possible backup power source of a small capacity is unable to bear this consumption of electric power, lowering the voltage sharply.

In the foregoing description, the input circuit is an inverter circuit; although it may be an alternative type of circuit with similar results. This is because the supply line of the CMOS-input-type IC is connected to the ground line via the source and drain of the p-channel MOSFET and the drain and source of the n-channel MOSFET and consequently, a rush current flows for a long time to sharply lower the voltage of the backup power source.

Since the voltage lowering time is 50-100 msec, which is very long as compared to the operating time 100-200 ns of SRAM, the data held in the SRAM will be destroyed during that time.

For this reason, in the conventional game cartridge, it has been a common practice to cut off the custom IC, which controls an SRAM, from the backup power source. After shifting from the main power source to the backup power source, the conventional game cartridge also takes the trouble of controlling the SRAM into a standby mode, in which the SRAM only holds data, by using a standby-mode-dedicated circuit in the form of a discrete circuit independent of the custom IC. With this conventional method, however, the number of components of the entire circuit would increase, which results in an increased cost of production.

SUMMARY OF THE INVENTION

It is therefore an object of this invention to provide a CMOS-input-type IC which is free from any voltage drop of a power source due to a rush current when the power source is switched from a main power source to a backup power source.

Another object of the invention is to provide a power source switching circuit for the CMOS-input-type IC described above.

According to a first aspect of the invention, there is provided a CMOS-input-type IC comprising: an input terminal to which a signal is to be inputted; a switching signal terminal to which a switching signal is to be inputted; clamping means for cooperating with the input terminal; wherein the clamping means includes an output buffer circuit which forcibly lowers or raises the signal, on the input terminal, to a low level or a high level, respectively, when the switching signal is inputted to the switching signal terminal.

According to a second aspect of the invention, there is provided, a power source switching circuit for controlling the switching of a power source, for a CMOS-input-type IC, between a main power source and a backup power source, the power source switching circuit comprising: voltage monitoring means for outputting the switching signal to the switching signal terminal of CMOS-input-type IC when a voltage of the main power source is lowered to less than a predetermined reference value; and power source shifting means for shifting the power source of the CMOS-input-type IC from the main power source to the backup power source based on the switching signal outputted from the voltage monitoring means.

In operation, the power source switching circuit of this invention monitors any voltage drop of the main power source by using the voltage monitoring means and outputs a switching signal when the voltage is lowered to less than a predetermined reference value.

The power source shifting means shifts the power source of the CMOS-input-type IC from the main power source to the backup power source based on the switching signal.

Concurrently with this, the CMOS-input-type IC drives the clamping means, which is composed of output buffer circuits cooperating with the respective input terminals, based on the input switching signal to the switching signal terminal, and controls the input signal, to the input terminal to forcibly lower or raise the input signal to the low level or the high level, respectively.

With this arrangement, it is possible to keep the CMOS-input-type IC free from a rush current flowing therein over a long period time when the power source is shifted from the main power source to the backup power source, thus preventing any voltage drop in a small capacity.

The clamping breaking means of the CMOS-input-type IC should preferably be operated immediately before the power source is shifted from the main power source to the backup power source so that a rush current can be prevented more adequately from flowing during the power source shifting.

The above and other advantages, features and additional objects of this invention will be manifest to those versed in the art upon making reference to the following detailed description and the accompanying drawings in which a preferred embodiment incorporating the principles of this invention is shown by way of illustrative example.

BRIEF DESCRIPTION OF THE DRAWINGS

FIG. 5A and 5B show timing charts when the power source is switched from a main power source to a backup power source.

FIGS. 7A, 7B and 7C show how transitional area of an inverter circuit charges with respect to the change of voltage of an input signal to the input terminal.

DETAILED DESCRIPTION

Figure 2:
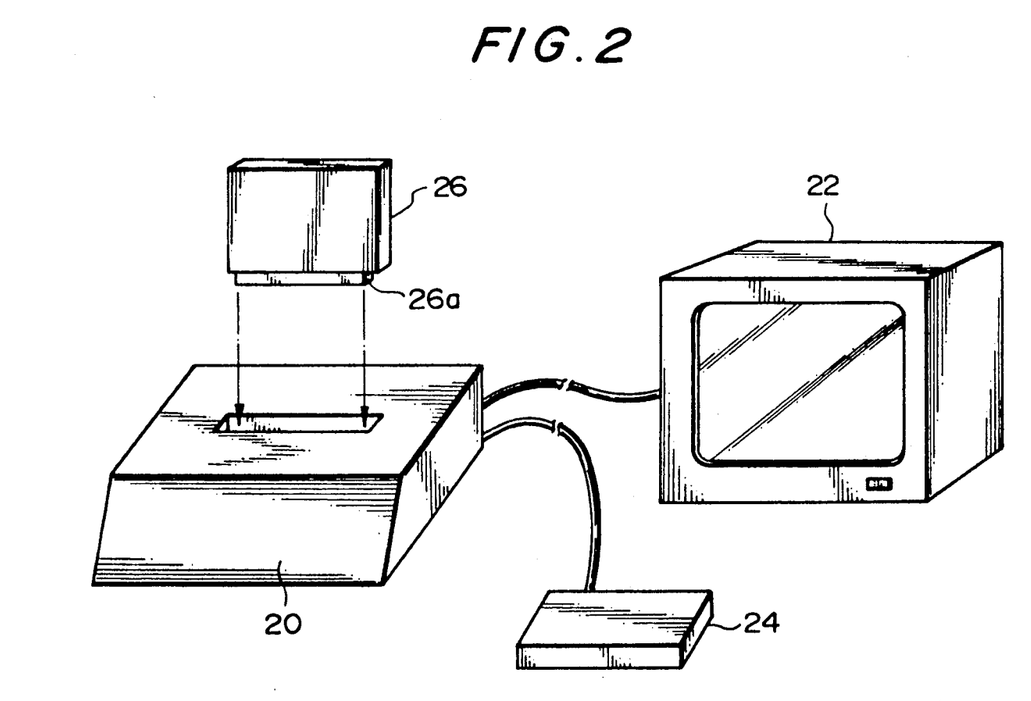
FIG. 2 is a perspective view showing a TV game system to which this invention is adapted.

The principles of this invention are particularly useful when embodied in a CMOS-input-type IC for a TV game system such as shown in FIG. 2.

The TV game system of FIG. 2 generally comprises a game machine 20 in which a game arithmetic circuit is incorporated, a CRT 22 connected to the game machine 20, and a game operating unit 24.

In the game machine 20, a game cartridge 26 as an external storage is detachably inserted. The game cartridge 26 has a ROM in which a game program is stored, and an SRAM in which various kinds of game data are written.

Figure 3:
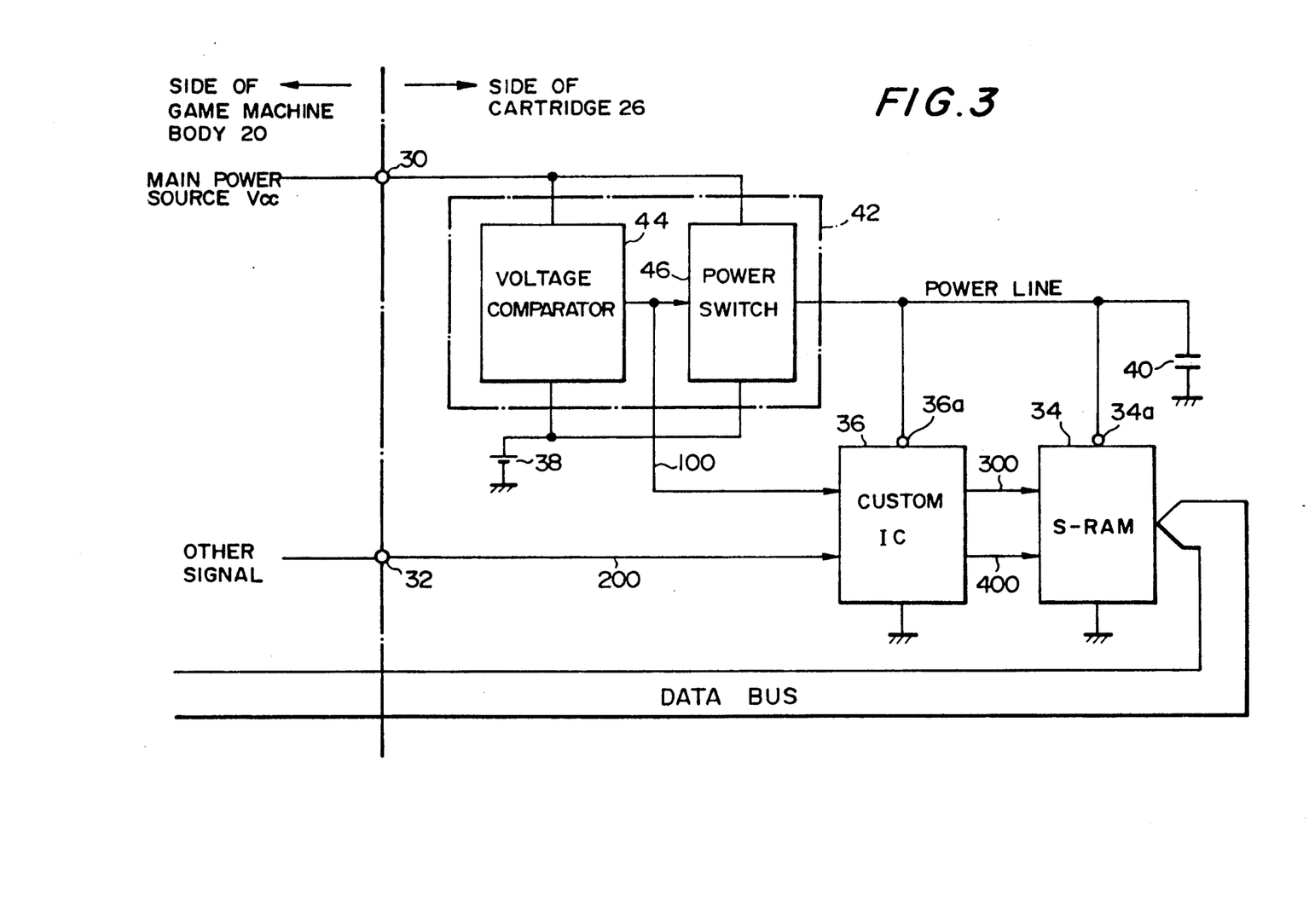
FIG. 3 is a block diagram showing a portion of a game cartridge of FIG. 2.

As shown in FIG. 3, the game cartridge 26 has in its connector portion 26a (FIG. 2) a power source terminal 30 and an input/output terminal 32. As it is inserted in the game machine 20, the game cartridge 26 is connected to the main power source Vcc of the game machine 20 via a power source terminal 30 and also to the input/output terminal of the game machine 20 via the input/output terminal 32.

In the game cartridge 26, there are provided SRAM 34 in which data for operating various kinds of games is written, a CMOS-type custom IC 36 which serves as a control circuit for the SRAM 34, a backup power source 38 and a backup condenser 40 for backup to the main power source Vcc, and a power source switching control circuit 42.

As long as it is used as a backup to the CMOS-type custom IC 36 and the SRAM 34, which consume a small amount of electric power, the backup power source 38 has a capacity adequate for the several-year backup. But such a capacity of the backup power source 38 is inadequate to cover the amount of consumed current employed in normal operation. If a rush current flows in the custom IC 36 for a long time in the same manner as in the conventional art, the backup condenser 40 added to the power supply line cannot withstand so that its supply voltage is lowered sharply.

The power source switching control circuit 42 is composed of a voltage comparator 44 and a power source switch 46.

The voltage comparator 44 functions as a voltage monitoring means; it normally compares the main power source Vcc with the voltage of the backup power source 38 and outputs a switching signal 100 to the power source switch 46 and the custom IC 36 when the voltage of the main power source Vcc is lowered below the voltage of the backup power source 38.

With the main power source Vcc being normally connected from power source terminal 30 to the respective power source terminals 36a, 34a of the custom IC 36 and the SRAM 34 when the switching signal 100 is outputted. the power source switch 46 switches the power source, from the main power source Vcc to the backup power source 38 so as to connect the backup power source to power source terminals 36a and 34a.

In the illustrated embodiment, the main power source Vcc and the backup power source 38 are preset to 5 V and 3 V, respectively. When the game cartridge 26 is inserted in the game machine 20, an operating voltage is supplied to the custom IC 36 and the SRAM 34 from the main power source Vcc because the voltage of the main power source Vcc is usually higher than the voltage of the backup power source 38.

The custom IC 36 functions to control the SRAM 34 while operating with the main power source Vcc and functions as a standby mode switching circuit to control the SRAM 34 in a standby mode while operating with the backup power source 38.

With the main power source Vcc, the custom IC 36 performs various kinds of control operations based on input control signal 200 from the game machine 20 via the input/output terminal 32 and outputs a control signal 300 and the an address signal 400 to the SRAM 34. The control signal 300 is exemplified by CE, OE or R/W.

The CE signal is a chip enable signal which selects an arbitrary SRAM from a plurality of SRAMs 34 (only one SRAM is illustrated in FIG. 3 for clarity). The OE signal is an output enable signal which controls the selected SRAM 34 to a readable state. The R/W signal is a read/write signal which controls writing and reading of the selected SRAM.

The SRAM 34 switches between an operative mode enabling writing/reading and a standby mode simply holding the written data. The SRAM 34 also performs writing/reading data in the area designated by the address signal 400, based on the OE and R/W signals input to SRAM 34 while in the operative mode.

If the game cartridge 26 is removed from the game machine 20 as the player quits a game, or if the voltage of the main power source Vcc drops from a cause during playing a game, the power source switch unit 46 automatically switches the power source of the cumstom IC 36 and the SRAM 34 from the main power source Vcc to the backup power source 38 so that the custom IC 36 controls the SRAM 34 to the standby mode to hold the data written during the interruption of the game.

A significant feature of this invention, is that it is possible to minimize the development of a possible rush current in the CMOS-type custom IC 36 to thereby prevent a temporary drop of the supply voltage of the backup power source 38. Therefore, it is possible to prevent any data in the SRAM 34 from being destroyed during the shifting of the power source, which has been a common problem with the conventional arrangement.

Figure 1:
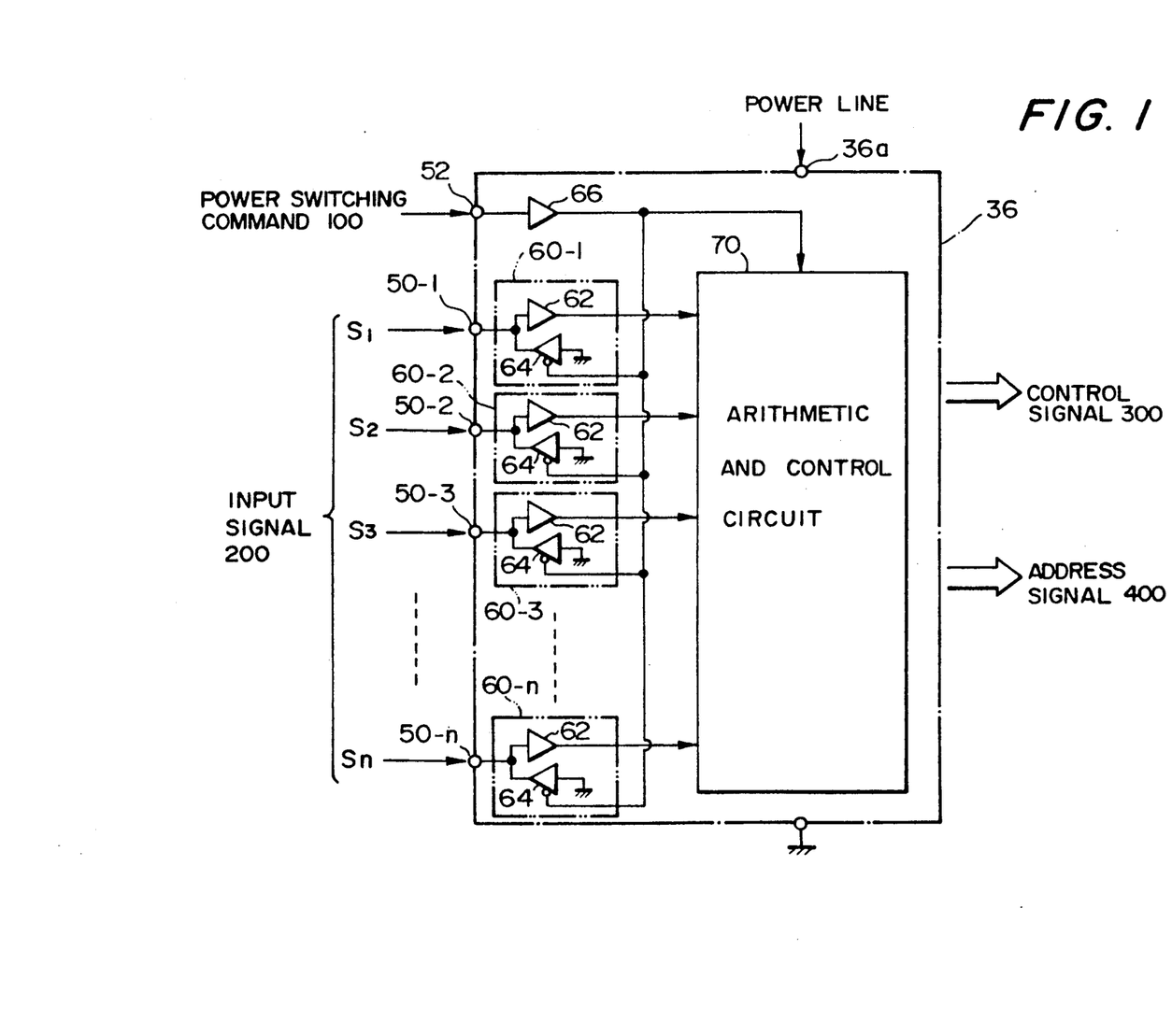
FIG. 1 is a block diagram showing a preferred embodiment of a CMOS-input-type IC according to this invention.

FIG. 1 shows the detailed structure of the CMOS-type custom IC 36. As shown in FIG. 1, the custom IC 36 comprises a power source terminal 36a to which a supply voltage is supplied via the power source switch unit 46, a plurality of input terminals 50-1, 50-2, ... 50-n to which the input signal 200 is to be inputted, and a switching signal terminal 52 to which the switching signal 100 is to be inputted. Input signals S1, S2, ... Sn to the respective input terminals 50-1, 50-2, ... 50-n are inputted to arithmetic and control circuit 70 input via input clamping circuits 60-1, 60-2, ... 60-n, respectively.

Each of the clamping circuits 60-1, 60-2, ... 60-n includes a bidirectional buffer circuit which (i) usually outputs a respective one of the input signals S1, S2, ... Sn from an input terminal to the arithmetic and control circuit 70 and which (ii) alternatively forcibly lowers or raises the respective input signal 200 to the low level or the high level, respectively, when the switching signal 100 is inputted to the switching signal terminal 52.

In the illustrated embodiment, the CMOS-input-type IC is a gate-array-type custom IC in the form of a bidirectional buffer which uses both a first buffer 62 as an input buffer and a second buffer 64 as an output buffer and which is connected to the input terminal 50. The second buffer 64 is connected at its input side to the ground and at its output side to the input terminal 50, and therefore serves as a clamping circuit to forcibly lower the input signal to the low level. If the input side of the second buffer 64 is connected to the power supply line, the CMOS-input-type IC then serves as a clamping circuit to forcibly raise the input signal 200 to the high level.

The first buffer 62 is connected at its input side to the input terminal 50 and at its output side to the arithmetic and control circuit 70 and hence serves to direct the input signal 200 to the arithmetic and control circuit 70.

The second buffer 64 is a tri-state CMOS buffer having an input, an output and a gate signal line; the output side assumes a high-impedance state and a conductive state, depending on the state of this gate signal line. The switching signal terminal 52 is connected to the gate signal line of the second buffer 64 via a buffer 66 and switches the second buffer 64 from the high-impedance state to the conductive state when the switching signal 100 is inputted.

Thus the second buffer 64 normally assumes the high-impedance state until the switching signal 100 is inputted, so that the individual input signals S from the respective input terminal are instantly inputted to the first buffer 62 and then to the arithmetic and control circuit 70.

As soon as the switching signal 100 is inputted, the second buffer 64 assumes the conductive state so that its input side is connected to the low level while its output side is connected to the ground. As a result, irrespective of whether the signal S to the input terminal 50 is high or low, the input side of the first buffer 62 is conducted to the ground so as to forcibly and instantly be set to the low level, thus preventing the development of a rush current flowing over a long time like the conventional art.

Figure 5B:
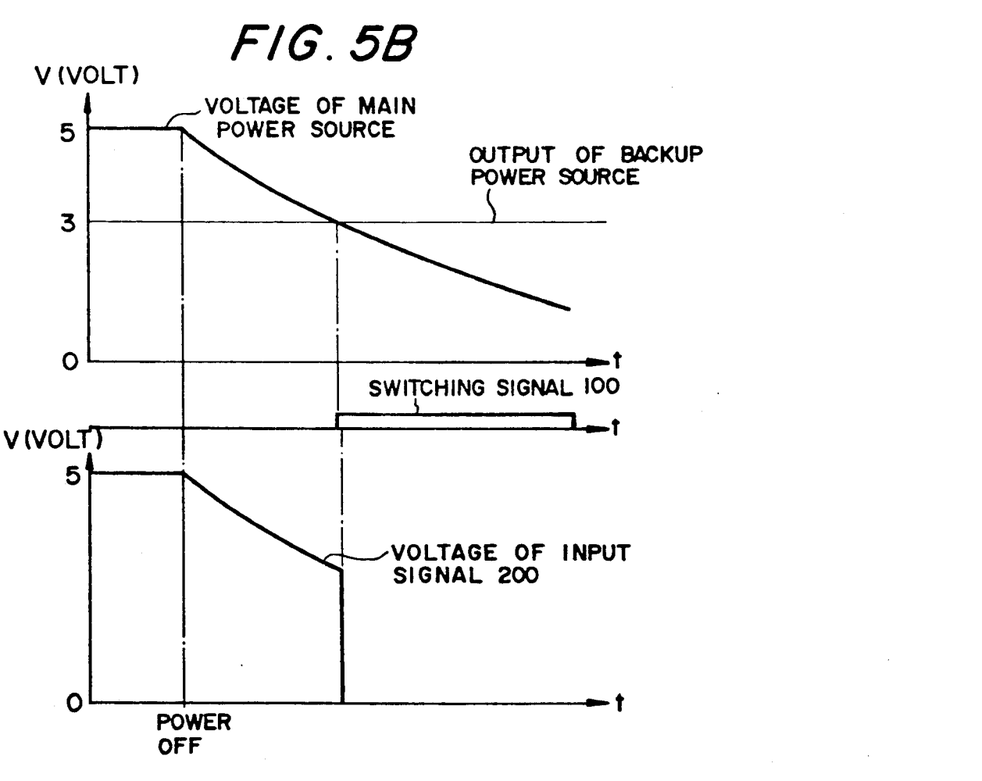
FIG. 5B is a timing chart of this invention.

FIG. 5B is a timing chart showing high level input signal S to input terminal 50 when the power source is switched from the main power source Vcc to the backup power source 38.

When the voltage of the main power source Vcc is lowered to a level below the voltage of the backup power source 38, the voltage comparator 44 outputs a switching signal 100.

The custom IC 36 inputs this switching command (100) to the second buffer 64 of the respective clamping circuit 60-1, 60-2, . . . 60-n to forcibly set the voltage of the respective input terminal 50-1, 50-2, . . . 50-n to the low level.

At that time, the time from when the switching signal 100 is outputted to when the voltage of the input terminal 50 is set to the low level is about several nsec so that the time a possible rush current flows can be reduced to a value less than a several-tens-thousandth of the conventional CMOS-type custom IC.

Assuming that a rush current flows in the custom IC 36 for such a short period time, even the backup condenser 40 added to the power supply line of the SRAM 34 can guarantee an adequate supply voltage of the backup side, thus holding the content of data of the SRAM 34 stably.

In the illustrated embodiment, the power source switching action by the power source switch unit 46 is performed substantially concurrently with the action of the clamping circuit 60. Alternatively, the action of the clamping circuit 60 may somehow precede the power switching action to minimize the influence of a rush current remarkably, thereby holding the data in the SRAM 34 with improved stableness.

As is well known in the art, in the CMOS-type custom IC, buffers located between the respective input terminals 50-1, 50-2, . . . 50-n and the arithmetic and control circuit 70 may be any desired structure at the user's need. Therefore it is possible to realize the custom IC 36 of FIG. 1 with ease.

In most of custom ICs such as gate arrays and standard cells, since both an input buffer and an output buffer are provided at the input/output terminals, one of the input and output buffers are selectively usable as the user's need, thus constituting a bidirectional buffer. Accordingly it is possible to effectively utilize the circuit prepared in the custom IC.

This invention should by no means be limited to the foregoing specific examples; various modifications may be suggested as reasonably come within the scope of this invention.

For example, although this invention is applied to the game cartridge 26 in the illustrated embodiment, the invention may be any one of various other kinds of circuit structures if it is a CMOS-input-type IC in which the power source may be switched between a main power source and a backup power source. For example, this invention may be used in a handy word processor, a laptop personal computer, and similar machine, all being equipped with a backup power source.

Also the invention may be adopted to an IC card in which SRAMs and a backup power source are built, with the same results.

Further, the invention should by no means be limited to the CMOS-type custom IC and may be any one of various other kinds of CMOS-input-type ICs.

Still further, in the illustrated embodiment, the CMOS-input-type IC is used for controlling the SRAMs; this invention should not be limited to this specific example.

As mentioned above, according to this invention, since no rush current develops in the CMOS-input-type IC for a long time during switching the power source from the main power source to the backup power source, it is possible to prevent a drop of supply voltage as caused from any possible rush current.

More particularly, the CMOS-input-type IC of this invention is free from the development of rush current during the power source switching. Besides, a standby mode switching circuit, which has conventionally been separately provided by using discrete parts in order to switch RAMs to the standby mode during the power source shifting, can be built in the CMOS-input-type IC. As a consequence, even when the RAMs are to be controlled by using the CMOS-input-type IC, it is possible to minimize the total number of components of its control circuit, thus guaranteeing an improved control circuit which is simple in construction and is hence inexpensive to manufacture.

What is claimed is:

1. A CMOS-input-type IC comprising:
   (a) an input terminal to which a signal is to be inputted;
   (b) a switching signal terminal to which a switching signal is to be inputted; and
   (c) clamping means for cooperating with said input terminal;
   (d) wherein said clamping means forcibly lowers or raises the signal, which is to be inputted to said input terminal, to a low level or a high level, respectively, when the switching signal is inputted to said switching signal terminal.

2. A CMOS-input-type IC according to claim 1, wherein said clamping means is a bidirectional buffer circuit comprising first and second buffers, said first buffer being an input buffer connected at its input side to said input terminal, and said second buffer being an output buffer connected at its output side to said input terminal an at its input side to one of a high level terminal and a low level terminal; and
   wherein said output buffer switches between a high-impedance state and a conducting state based on the switching signal inputted from said switching signal terminal.

3. A CMOS-input-type IC according to claim 2, wherein said second buffer is a tri-state CMOS buffer comprising said input side, said output side and a gate signal terminal, wherein said gate signal terminal is connected to a gate signal line and electrically communicates with said switching signal terminal.

4. A CMOS-input-type IC according to claim 3, further comprising an arithmetic and control circuit for performing an operation based on the signals inputted from said input terminal and said switching signal terminal,
- wherein said first buffer is an input buffer connected at its input side to said input terminal and at its output side to said arithmetic and control circuit, and
- wherein said second buffer is connected at its input side to one of the high level terminal and the low level terminal and at its output side to the input side of said first buffer, so as to force the input side of said first buffer to one of the low level and high level when the switching signal is inputted to said gate signal terminal to clamp the input signal.

5. A CMOS-input-type IC according to claim 1, further comprising an arithmetic and control circuit for performing an operation based on the signals inputted from said input terminal and said switching signal terminal, and
- wherein said clamping means is disposed between said input terminal and said arithmetic and control circuit.

6. A CMOS-input-type IC according to claim 5, wherein said arithmetic and control circuit controls an SRAM so that said SRAM operates selectively using one of a main power source and a backup power source, and also controls said SRAM so that when said main power source is in use, the SRAM executes writing/reading of data to and from said SRAM based on the input signal inputted from said input terminal, and also controls said SRAM so that said SRAM operates in a standby mode when said backup power source is in use.

7. A power source switching circuit for controlling the switching of a power source, for a CMOS-input-type IC between a main power source and a backup power source, the CMOS-input-type IC comprising an input terminal to which a signal is inputted, a switching signal terminal to which a switching signal is inputted, and clamping means for cooperating with the input terminal, the clamping means comprising an output buffer circuit which forcibly lowers or raises the signal, which is to be inputted to the input terminal, to a low level or a high level, respectively, when the switching signal is inputted to the switching signal terminal, said power source switching circuit comprising:
- (a) voltage monitoring means for outputting the switching signal to the switching signal terminal of the CMOS-input-type IC when a voltage of the main power source is less than a predetermined reference value; and
- (b) power source shifting means for shifting the power source of the CMOS-input-type IC from the main power source to the backup power source based on the switching signal outputted from said voltage monitoring means.

8. A power source switching circuit for controlling the switching of a power source for a CMOS-input-type IC and an SRAM between a main power source and a backup power source, the CMOS-input-type IC comprising and input terminal to which a signal is to be inputted, a switching signal terminal to which a switching signal is to be inputted, clamping means for cooperating with the input terminal, the clamping means comprising an output buffer circuit which forcibly lowers or raises the signal, which is to be inputted to the input terminal, to a low level or a high level, respectively, when the switching signal is inputted to the switching signal terminal, and an arithmetic and control circuit for performing an operation based on the signals inputted from the input terminal and the switching signal terminal, wherein the arithmetic and control circuit controls an SRAM so that said SRAM operates selectively using one of the main power source and the backup power source, and also controls said SRAM so that when said main power source is in use the SRAM executes writing/reading of data to and from the SRAM based on the input signal inputted from the input terminal, and also controls the SRAM so that said SRAM operates in a standby mode when the backup power source is in use, the clamping means being disposed between the input terminal and the arithmetic and control circuit, said power source switching circuit comprising:
- (a) voltage monitoring means for outputting the switching signal to the switching signal terminal of the CMOS-input-type IC when a voltage of the main power source is less than a predetermined reference value; and
- (b) power source shifting means for shifting the power source, for both the CMOS-input-type IC and the SRAM, from the main power source to the backup power source based on the switching signal outputted from said voltage monitoring means.

9. A power source switching circuit according to claim 7, wherein said voltage monitoring means outputs the switching signal so as to cause said clamping means to perform a signal clamping action prior to the shifting of the power source from the main power source to the backup power source by said power source shifting means.

10. A power source switching circuit according to claim 8, wherein said voltage monitoring means outputs the switching signal so as to cause said clamping means to perform a signal clamping action prior to the shifting of the power source from the main power source to the backup power source by said power source shifting means.

11. A game cartridge detachably insertable in a game apparatus body having a main power source, said game cartridge comprising:
- (a) a power source terminal adapted to be connected to a terminal of the main power source of the game apparatus body;
- (b) an input/output terminal adapted to be connected to a signal input/output terminal of the game apparatus body;
- (c) an SRAM in which game data are written;
- (d) a CMOS-input-type IC for controlling said SRAM, said CMOS-input-type IC comprising an input terminal to which a signal is to be inputted from said input/output terminal, a switching signal terminal to which a switching signal is to be inputted, an arithmetic and control circuit for executing when the main power source is in use writing/reading of data to and from said SRAM based on the input signal inputted from said input terminal, and for controlling said SRAM so that said SRAM operates in a standby mode when the switching signal is inputted, and clamping means disposed between said input terminal and said arithmetic and control circuit, said clamping means comprising an output buffer circuit which forcibly lowers or raises the signal, which is to be inputted to said input terminal, to a low level or a high level, respectively, when the switching signal is inputted to said switching signal terminal;

(e) a backup power source for both said CMOS-input-type IC and said SRAM; and (f) a power source switching circuit for performing switching of the power source, said power source switching circuit comprising voltage monitoring means for outputting the switching signal to said switching signal terminal of said CMOS-input-type IC when a voltage of the main power source is less than a predetermined reference value, and power source shifting means for shifting the power source, for both said CMOS-input-type IC and said SRAM, from the main power source to said backup power source based on the switching signal outputted from said voltage monitoring means.

12. A game cartridge according to claim 11, wherein said voltage monitoring means outputts the switching signal to clamping means so as to cause said clamping means to perform a signal clamping action before the switching of the power source from said main power source and said backup power source by said power source switching means.

* * * * *